US 6,620,719 B1

(12) United States Patent
Andry et al.

(10) Patent No.: US 6,620,719 B1
(45) Date of Patent: Sep. 16, 2003

(54) METHOD OF FORMING OHMIC CONTACTS USING A SELF DOPING LAYER FOR THIN-FILM TRANSISTORS

(75) Inventors: Paul Stephen Andry, Mohegan Lake, NY (US); Evan George Colgan, Chestnut Ridge, NY (US); John C. Flake, Mohegan Lake, NY (US); Peter Fryer, Yorktown Heights, NY (US); William Graham, Irvington, NY (US); Eugene O'Sullivan, Nyack, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/540,350

(22) Filed: Mar. 31, 2000

(51) Int. Cl.[7] .......................... H01L 21/44; H01L 21/84; H01L 21/425; H01L 21/331; H01L 21/4763
(52) U.S. Cl. .................. 438/597; 438/158; 438/161; 438/369; 438/527; 438/618; 438/682
(58) Field of Search ................. 438/571, 160, 438/586, 597, 161, 159, 158, 618, 621, 532, 365, 369, 527, 682, 537

(56) References Cited

U.S. PATENT DOCUMENTS 5,061,648 A * 10/1991 Aoki et al. ................. 438/161
5,202,273 A * 4/1993 Nakamura ................... 437/40
5,827,760 A * 10/1998 Seo ............................. 438/161
6,127,249 A * 10/2000 Hu ............................. 438/583
6,259,119 B1 * 7/2001 Ahn et al. .................... 257/72
6,294,815 B1 * 9/2001 Yamazaki et al. .......... 257/350

OTHER PUBLICATIONS

Moberg et al., "Electroless Deposition of Metals onto Organosilane Monolayers," J. Electrochem. Soc., vol. 144, No. 6, pp. L151–L153, Jun. 1997.
Yoshiki et al., "Electroless Copper Plating Using ZnO Thin Film Coated on a Glass Substrate," J. Electrochem. Soc., vol. 141, No. 5, pp. L56–L58, May 1994.

* cited by examiner

Primary Examiner—Caridad Everhart
Assistant Examiner—Chuong A Luu
(74) Attorney, Agent, or Firm—F. Chau & Associates, LLP

(57) ABSTRACT

A method for forming ohmic contacts for semiconductor devices, in accordance with the present invention, includes forming a layer containing metal which includes dopants integrally formed therein. The layer containing metal is patterned to form components for a semiconductor device, and a semiconductor layer is deposited for contacting the layer containing metal. The semiconductor device is annealed to outdiffuse dopants from the layer containing metal into the semiconductor layer to form ohmic contacts therebetween.

27 Claims, 7 Drawing Sheets

METHOD OF FORMING OHMIC CONTACTS USING A SELF DOPING LAYER FOR THIN-FILM TRANSISTORS

BACKGROUND OF THE INVENTION

1. Field of the Invention

The present invention relates to semiconductor fabrication, and more particularly to a method for forming ohmic contacts for thin film transistors (TFTs).

2. Description of the Related Art

Thin film transistors (TFTs) may be employed in a plurality of different applications. In one instance, TFTs are employed in active matrix displays for the purpose of pixel switching. There are a variety of TFT structures described in the prior art. Referring to FIGS. 1–4, four examples (in cross-section) are shown of TFT structures including two top gate designs (FIGS. 1 and 2) and two bottom gate designs (FIGS. 3 and 4).

Each of FIGS. 1–4 include commonly labeled elements which function in a same manner. Each structure includes a source S, a drain D, and a gate G. All structures are formed on a substrate 10 and include insulation layers 11.

FIG. 1 shows a structure similar to that found in silicon CMOS technology. This top gate TFT is common in polysilicon products where the gate. G is used as a shadow mask during S/D ion implantation. Laser irradiation is typically employed in this process flow, both for recrystallization of polysilicon 14 and for dopant activation in contact vias. A channel 15 is formed below gate G between source S and drain D. The TFT structure of FIG. 1 has S/D contacts 16 directly connected to the accumulated electron channel 15, i.e. the S/D and the channel are coplanar.

FIGS. 2 through 4 are employed when a semiconducting layer 22 (e.g., amorphous silicon (a-Si)) in a channel region 20 (under the gate G in FIG. 2 and over the gate G in FIGS. 3 and 4) of the TFT is of low mobility and essentially undoped, e.g. a-Si. Since the electron mobility is substantially larger than the hole mobility in a-Si, the TFTs have heavily n-type (n+) D/S contact regions 24. FIG. 2 shows a simple top gate structure where S metal and D metal are made ohmic either by encapsulation with n+ silicon or by a surface plasma doping treatment to form layer 24.

FIGS. 3 and 4 show two bottom gate TFT structures, whose channels and S/D contacts are on opposite sides of the a-Si layer; for this reasons they are known as inverted staggered type TFTs. FIG. 3 shows what is known as a channel passivated or an etch-stopper type TFT, while FIG. 4 shows a back-channel etch (BCE)structure. These structures normally employ a plasma enhanced chemical vapor deposited (PECVD) n+ layer 24 between metal employed for source S and drain D and a-Si layer 22. The TFT structures of FIGS. 3 and 4 differ, in that, the a-Si channel region 20 of FIG. 3 is protected from attack during the n+ etching step for layer 24 by an additional patterned layer of nitride known as an etch stop layer 23.

In the TFT structure of FIG. 4, any n+ over-etch removes a portion of the active channel a-Si layer 22. The inverted staggered structure (FIG. 3) needs additional PECVD and photoexposure steps thereby making it more costly, but the TFT performance is better than with the BCE TFT (FIG. 4). One reason for this is that the a-Si layer 22 in the BCE structure should be made thicker to allow for the n+ overetch, and this increases the parasitic resistance at the S/D ohmic contacts, i.e., the contacts formed by layer 24.

Generally the BCE-type TFTs have shorter channel lengths to help compensate for lower mobility. This in turn places additional burden on the contacts since a greater portion of the total potential across the TFT is dropped across the D/S contacts when the channel is shorter.

For each of the above-mentioned TFTs, there exist tradeoffs in complexity, cost and performance. Many of these tradeoffs stem from a common problem—how to form ohmic S/D contacts which are needed for hole blocking and efficient electron injection. The etch-stopper or channel passivated TFT accepts greater process complexity for good a-Si channel performance, while the BCE process trades channel performance for simplicity.

Referring again to FIG. 2, in the top gate TFT, n+ deposition for layer 24 may be used, but this requires two S/D photosteps since the n+ layer 24 must completely clad the S/D metal, including any tapered edge, to be effective. Plasma-doping may be employed, where, for example, a thin layer of P atoms are deposited on the surface of the patterned S/D metal thereby doping the subsequently deposited a-Si layer 22 adjacent to the contacts. This method is the subject of U.S. Pat. No. 5,061,648 where the S/D material is a transparent conductive oxide (TCO), e.g. ITO. U.S. Pat. No. 5,061,648 patterns S/D material and introduces dopant species onto/into the S/D surface in separate steps. Disadvantages of this method, besides the limitation of using TCO for the S/D, are that the plasma doping process window is necessarily narrow to avoid doping a gate insulator adjacent to the channel region, and the doped layer properties cannot be accurately controlled.

In conventional structures such as those shown in FIGS. 2–4, layer 24 is highly-doped and, is responsible for the formation of ohmic contacts. Layer 24 is typically formed by performing one of the following steps: i) depositing an n+ plasma enhanced chemical vapor deposition (PECVD) layer 24, ii) plasma doping exposure to form layer 24, or iii) ion implantation to form layer 24.

Therefore, a need exists for a method for simplifying the formation of ohmic contacts for thin film transistors. A further need exists for a method for forming ohmic contacts without the need for an intermediate fabrication step, for example, ion implantation, plasma doping or n+ plasma enhanced chemical vapor deposition.

SUMMARY OF THE INVENTION

A method for forming ohmic contacts for semiconductor devices, in accordance with the present invention, includes forming a layer containing metal which includes dopants integrally formed therein. The layer containing metal is patterned to form components for a semiconductor device, and a semiconductor layer is deposited for contacting the layer containing metal. The semiconductor device is annealed to outdiffuse dopants from the layer containing metal into the semiconductor layer to form ohmic contacts therebetween.

Another method for forming ohmic contacts for thin film transistors; in accordance with the invention, includes the steps of patterning a gate conductor on a substrate, forming an insulation layer over the gate structure, depositing a layer containing silicon, forming a layer containing metal which includes dopants integrally formed therein in contact with the layer containing silicon, patterning the layer containing metal to form a gap over the gate conductor, the layer containing metal forming a source and drain for the thin film transistor and annealing the thin film transistor to outdiffuse dopants from the layer containing metal into the layer containing silicon to form ohmic contacts therebetween.

Yet another method for forming ohmic contacts for thin film transistors, in accordance with the present invention includes steps of depositing an insulation layer on a substrate, forming a layer containing metal which includes dopants integrally formed therein over the insulation layer, patterning the layer containing metal to form a source and a drain for the thin film transistor having a gap therebetween, depositing a layer containing silicon in contact with the insulation layer in the gap and in contact with the layer containing metal, annealing the thin film transistor to outdiffuse dopants from the layer containing metal into the layer containing silicon to form ohmic contacts therebetween, patterning a gate dielectric over the gap and forming a gate conductor over the gap.

In other methods, the step of patterning the layer containing metal to form components for a semiconductor device may include the step of patterning the layer containing metal to form source and drain metallizations for a thin film transistor. The layer containing metal may include at least one of cobalt, molybdenum, titanium, chromium and nickel. The layer containing metal may include between about 1 to about 30 atomic percent of the dopants. The layer containing metal may include at least one of phosphorous, antimony, arsenic and boron integrally formed therein.

The step of depositing a semiconductor layer may include the step of depositing a layer of one of amorphous silicon and polycrystalline silicon. The step of annealing the semiconductor device may include the step of annealing the semiconductor device at temperatures between about 300° C. and about 400° C. for between about 10 and about 30 minutes. The step of forming a layer containing metal may include the steps of forming a metal-dopant layer for contacting the layer containing silicon, and forming a conductive layer which contacts the metal-dopant layer. The layer containing metal may include a transparent conductive oxide (TCO). The step of forming a layer containing metal may include the step of forming the layer containing metal by one of co-sputtering, sputtering from a composite target, evaporation, thermal chemical vapor deposition and chemical solution deposition. The step of depositing a layer containing silicon may include the step of depositing a layer of one of amorphous silicon and polycrystalline silicon.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

Figure 1:
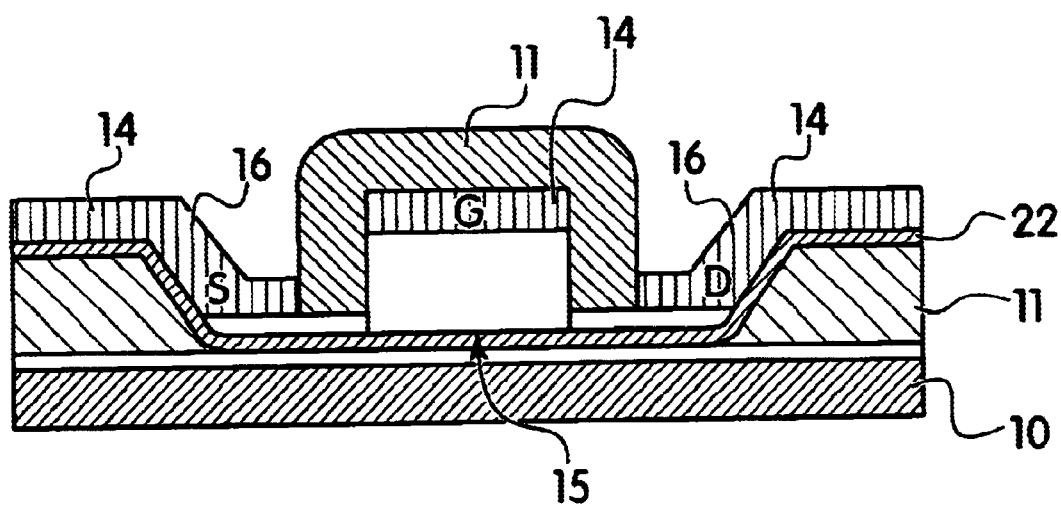
FIG. 1 is a cross-sectional view of a complementary metal oxide semiconductor (CMOS) type field effect transistor in accordance with the prior art.
Figure 2:
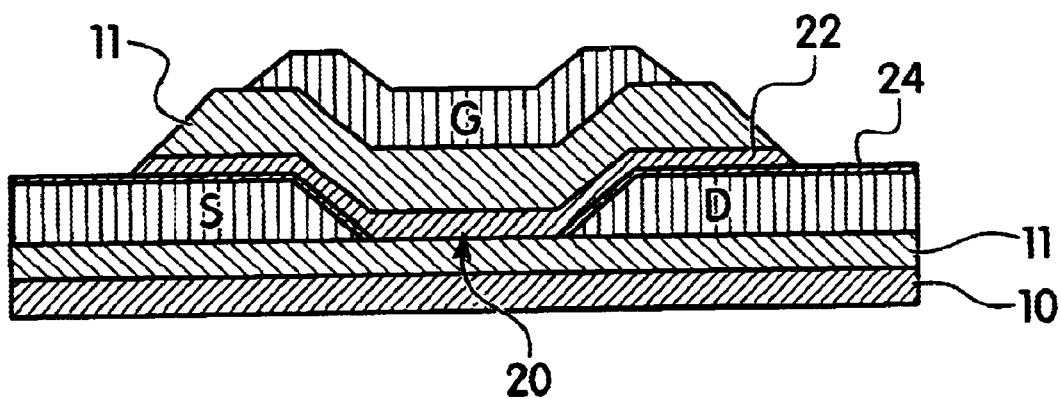
FIG. 2 is a cross-sectional view of a top gate thin film transistor in accordance with the prior art.
Figure 3:
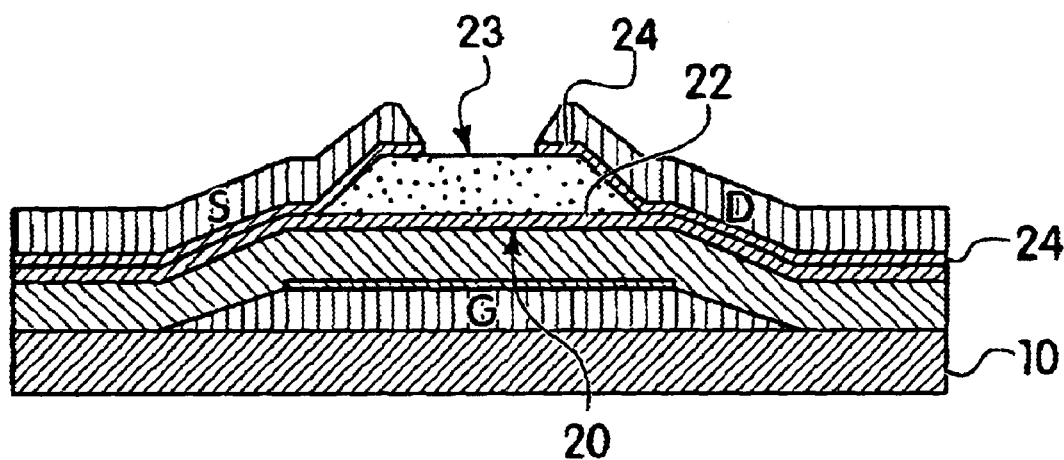
FIG. 3 is a cross-sectional view of an inverted staggered bottom gate thin film transistor in accordance with the prior art.
Figure 4:
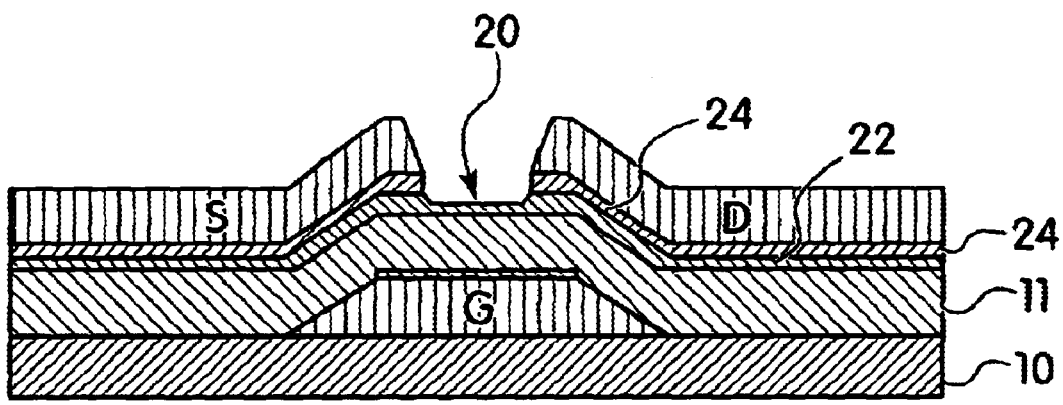
FIG. 4 is a cross-sectional view of a back-channel etch bottom gate thin film transistor in accordance with the prior art.

The present invention relates to thin-film transistors (TFTs), and more particularly to TFTs used as switching elements in active matrix liquid crystal displays (AMLCD). The present invention includes a method for forming ohmic drain-source (D/S) contacts of a TFT by employing a semiconducting layer which is preferably amorphous or polycrystalline silicon. D/S metal is included which may include one of a number of metals, for example, Co, Mo, Cr, Ni, and/or Ti. Advantageously, the metal composition also includes Group V or Group III dopant elements, e.g. P or B.

One aspect of the present invention is that the drain-source material includes the dopant species as part of its original composition. It is necessary only to place this material in contact with silicon and anneal for the formation of the low-resistance contacts to occur (through silicide formation and outdiffusion of dopants). There is no need for any intermediate step such as n+ silicon deposition, plasma doping treatment or ion implantation to form the ohmic contacts. Further, the self-doping metal materials and the process by which they form a low-resistance contact are compatible with large area flat panel processing. In the case of an active matrix liquid crystal display (AMLCD) array process, these materials drastically simplify the ohmic contact formation process which takes place to ensure good pixel charging characteristics in the finished AMLCD panel.

All of the above TFT designs, shown in FIGS. 1–4 as well as many other designs can benefit from improved performance and reduced complexity if an ohmic contact could be obtained at the D/S contacts without the need for ion implantation, plasma doping or n+ PECVD deposition. The present invention describes a method by which it is possible to achieve ohmic contacts by compositionally modifying a metal which, when placed in intimate contact with a thin silicon film and subsequently annealed forms a low-resistance contact.

Metals which form silicides, such as Co, Mo, Cr, Ni and Ti are preferred. Silicide formation is known in the microelectronics industry. When Si comes in contact with a metal, it is generally not thermodynamically stable and will react depending on the temperature and the nature of the metal/silicon interface. Advantageously, silicide formation in accordance with the present begins at lower temperatures for a given metal when the contact is formed with amorphous silicon (a-Si) rather than crystalline silicon, e.g. as low as 250° C. for CoSi.

By including the dopant species in the metal, it is possible to dope the adjacent silicon during a deposition or anneal process, especially if the dopant species is above its solubility limit in the metal. Thermal energy is used to drive dopant from the metal into the a-Si through decomposition of the metal compound, which may include, but is not limited to, forming a silicide. It is to be understood that the formation of a silicide may not be needed since dopants diffused into a silicon "matrix" may be sufficient to form the ohmic contacts. It is also to be understood that other materials other than silicon may be employed and doped according to the present invention. For example, these materials may include Si-containing materials, Ge-containing materials or a combinations thereof (e.g., a-SiGe, poly-SiGe, etc.).

In the methods described below there is no need for any external implantation or plasma process since the silicon-doping species is compositionally present in the metal compound from the start.

The TFT process flow for building the individual elements and layers of any of the TFT structures shown in, for example in FIGS. 1–4 is known to those skilled in the art. The present invention may be employed in/on any of the structures shown in FIGS. 1–4, other thin film transistor structures or other devices including ohmic contacts. The present invention will be described in terms of two illustrative examples. One example includes a top gate structure and the other includes a bottom gate structure. These examples should not be construed as limiting the invention.

Figure 5:
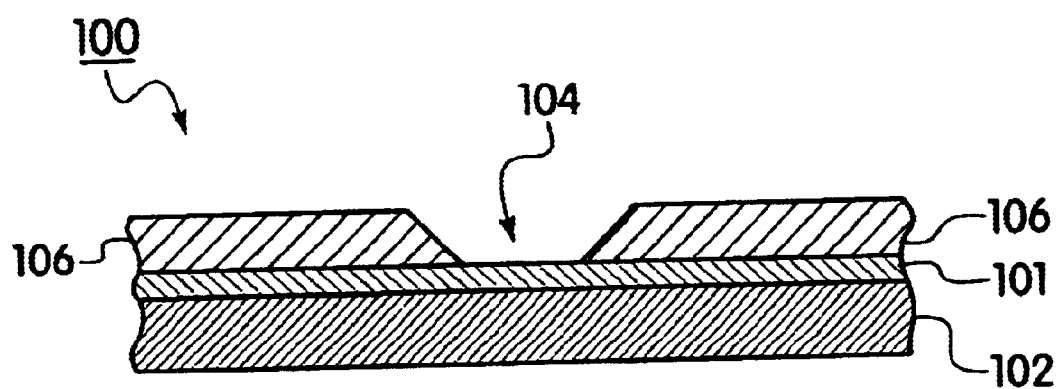
FIG. 5 is a cross-sectional view of a drain and source region of a top gate thin film transistor showing a metal-dopant layer formed and patterned in accordance with the present invention.

Referring now in detail to the figures in which like numerals represent the same or similar elements and initially to FIG. 5, a thin film transistor device 100 is shown including a transparent substrate 102, such as, for example, glass or quartz. An insulation layer 101 is formed on substrate 102, which may include a nitride or an oxide, for example. Source/drain (S/D) layer 106 is formed and patterned to form a gap 104. S/D layer 106 includes dopants for reacting with a semiconductor layer 108 to form ohmic contacts 110 (see FIG. 7).

Metals for layer 106 may include Co, Mo, Ni, Ti or other metals. Metals for layer 106 preferably include between about 1 to about 30 atomic percent of P, Sb, As or B. The metal-dopant compounds of layer 106 may be obtained by CVD decomposition of metalorganic compounds, by physical vapor deposition, such as co-sputtering or sputtering from a composite target, or by a chemical solution deposition such as electroplating or electroless plating.

Electroless metallization using metal-phosphorous alloys such as (NiP, NiWP, NiReP, CoP, CoWP, CuP, CuNiP, CoCuP) may be accomplished by various methods. To promote metal adhesion and catalytic seeding, a surface, such as glass, for example, may be roughened (etched) or grafted with organic compounds, such as the process described by, for example, Moberg et al, in "Electroless deposition of metals onto organosilane monolayers," Journal of the Electrochemical Society v 144 n Jun. 6, 1997, p L151–L153, or treated with inorganic compounds such as described by Yoshiki et al. in "Electroless copper plating using ZnO thin film coated on a glass substrate," Journal of the Electrochemical Society, vol. 141 no. May 5, 1994.

After the surface is treated and made catalytically active with Pd or some other catalyst (Pt, Ni, Au) the surface may be electrolessly plated with a metal-phosphorus alloy. Various methods (recipes) for electroless metal-phosphorous alloys may be employed. The metal-phosphorous alloys are deposited from solutions that contain a reducing agent such as sodium hypophosphite or potassium hypophosphite. The amount of phosphorous in the alloy may range from less than 1% to greater than 10% and it may be controlled by the bath composition and operating conditions such as pH, temperature, etc. The transport of phosphorous to the surface of the metal and transport into the semiconductor may be controlled by silicidation reactions, annealing conditions or surface treatments (forming gas or wet chemical processes).

Other deposition methods, for example, sputtering, evaporation, thermal chemical vapor deposition (CVD) may be employed for forming the metal-dopant layer 106. In the case of sputtering, for example, a substrate including a patterned light shield and coated with an insulator such as SiNx or SiOx is placed in a vacuum sputtering system, in a top gate TFT structure. For a bottom gate TFT, it is preferable that the substrate including only a gate metal pattern be placed in either an in-line or cluster chamber tool such that sequential gate insulator, a-Si and sputtered dopant metal (106) can be deposited in a single pump down without breaking vacuum. In the event that gate insulator and one of a-Si, poly-Si or poly-SiGe have already been deposited and exposed to atmosphere in a previous step, it is preferable that the surface be stripped of oxide using a weak HF acid solution before loading.

Once under vacuum flow of a suitable inert sputtering gas, preferably Ar is initiated at a pressure ranging from about 10 mTorr to about 500 mTorr. DC or RF power is applied to the targets which may include those of the magnetron configuration. If a composite target including the metal, such as Ni, and the dopant, such as P, (for a Ni(P) metal dopant layer 106) in the desired ratios is used control of a single power supply is called for. A power density ranging from about 0.05 to 0.5 Watts/cm$^2$ may be applied to the target for a fixed time to deposit the desired thickness which may vary from, for example, about 10 nm to about 500 nm.

If separate metal and dopant targets are used, two independent power supplies may be employed using power densities in the range described above. This method permits for active doping control of the metal layer. If the TFT is of the BCE type, the substrate temperature should not exceed about 50° C. during the sputtering process to ensure that no doping of the channel region takes place before the metal-dopant layer 106 can be patterned to form a gap centered over the gate region. Patterning of metal-dopants of layer. 106 may include shadow masking, photolithographic patterning using resists, polyimides or self-assembled monolayers (SAMS), followed by wet or dry etching. Patterning of layer 106 may also include direct seeding and plating from chemical solution in areas where contacts are to be formed.

Figure 6:
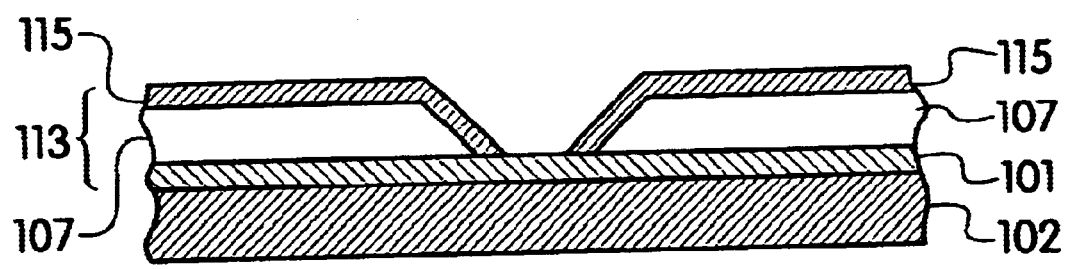
FIG. 6 is a cross-sectional view of a metal-dopant layer formed with a highly conductive metal layer in accordance with one embodiment of the present invention.

In one embodiment, shown in FIG. 6, a conductive layer 113 may include D/S metallization (e.g., data busline). Conductive layer 113 includes a highly conductive metal or oxide 107, such as, for example, patterned Cu of between about 1000 Å and about 1500 Å thickness, formed with tapered edges and coated with a layer 115 of one of the aforementioned metal-dopants, e.g., Co and P, whose thickness is between about 500 Å and 1000 Å.

Additionally, metal-dopant layers 115 may be used as cladding layers for previously deposited conductive layers, e.g., layer 107, including metals, such as Cu, and transparent conducting oxides, such as, indium tin oxide or indium zinc oxide. The previously deposited conductive layer 107 may also be pre-patterned, and, in this case, may also have a tapered edge to allow smooth coverage of the metal-dopant cladding layer 115 and semiconductor layer 108 (FIG. 7), if the a-Si semiconducting layer is deposited after the D/S patterning step.

It is to be understood that the invention is not limited to the structures shown. Other structures including metal lines, electronic components or other devices may employed the ohmic contacts formed in accordance with the present invention.

Figure 7:
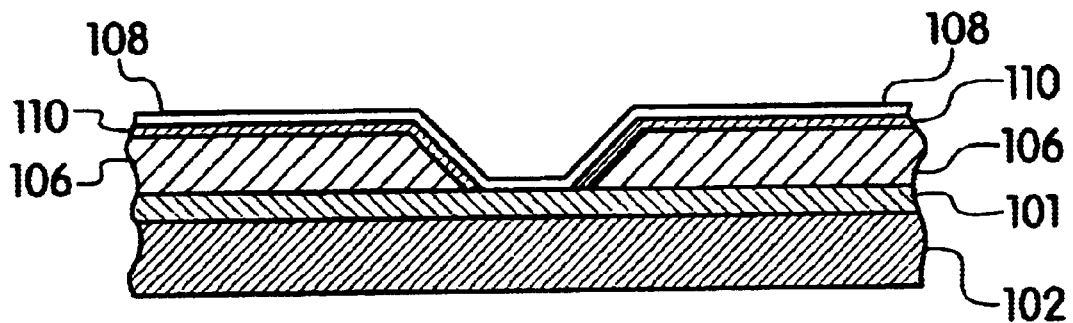
FIG. 7 is a cross-sectional view of a drain and source region of a top gate thin film transistor showing a silicon-containing layer formed in accordance with the present invention.

Referring to FIG. 7, patterned metal-dopant D/S layer 106 is placed in intimate contact with a-Si or polycrystalline Si layer 108. Contacts 106 are heated to form ohmic contacts 110 in layer 108 by outdiffusing dopants compositionally formed in layer 106.

Amorphous silicon (a-Si) deposition may be performed by evaporation, sputtering, or CVD. It is preferably performed in a PECVD reactor using silane and, if desired, hydrogen, helium or argon gas for dilution. The reactor pressure is preferably held between 0.1 and 2 Torr, with total gas flows between 200 and 2000 sccm. Power is preferably adjusted to give a deposition rate of between about 1 and about 10 Å/s. Substrate temperature during deposition is preferably in the range from about 250° C. to about 350° C. The a-Si layer thickness is preferably deposited to a thickness of between about 300 Å and about 1000 Å.

Post-anneal temperatures and times for forming ohmic contacts 110 will vary depending on the a-Si deposition temperature and time since a certain amount of self-doping and silicide formation may be expected to take place during this process.

For a-Si TFTs on glass substrates, anneal times may range from less than a minute (in the case of rapid thermal annealing (RTA)) to several hours, and temperatures may be in the range from 250° C. to 450° C. It is preferable that the post-deposition anneal of a-Si (or other material) take place at a temperature not significantly greater than that used during the actual a-Si layer deposition. Otherwise, an additional rehygrogenation step may be necessary. In the case of poly-Si, if either rapid thermal processing or excimer laser recrystallization has been used to form the poly-Si, a rehydrogenation step is preferred.

In one example, if the a-Si deposition process is at or below 300° C., preferable anneal temperatures for ohmic contact formation may include temperatures between about 300° C. and about 400° C. Preferred anneal times include between about 10 and about 30 minutes for an oven anneal. Annealing ambients include, e.g., vacuum, Ar, He, $N_2$, and forming gas (95% nitrogen/5% hydrogen), with forming gas being preferred for the annealing environment.

Figure 8:
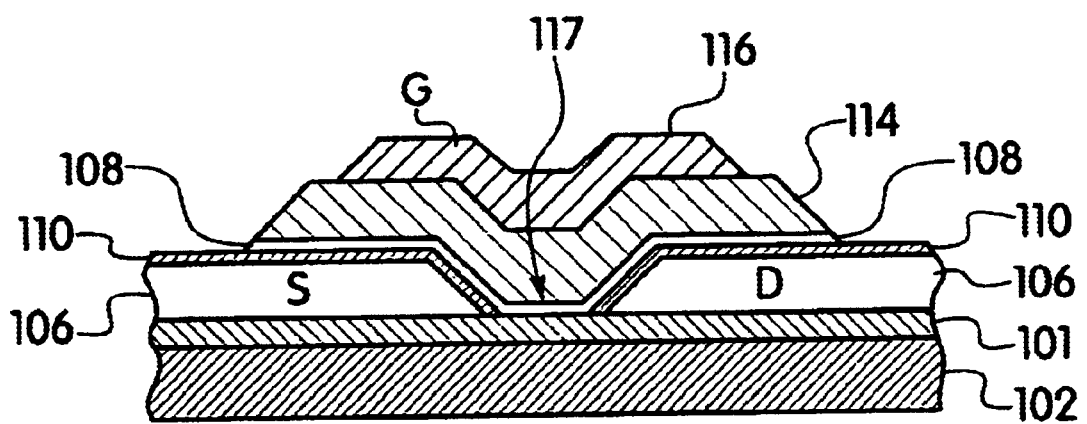
FIG. 8 is a cross-sectional view of the top gate thin film transistor showing a gate conductor and a gate insulator formed in accordance with the present invention.

Referring to FIG. 8, an insulating layer 114 is deposited and patterned along with layer 108. A patterned gate electrode (G) is formed over (top gate structure) a channel region 117 in layer 108 between source (S) and drain (D) in layer 106.

Figure 9:
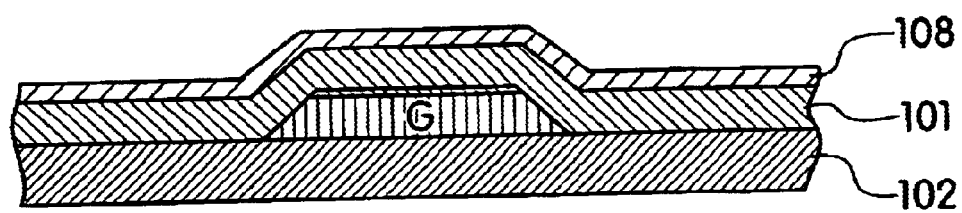
FIG. 9 is a cross-sectional view of a gate and channel region a bottom gate thin film transistor showing a silicon containing layer formed over a gate conductor and a gate insulator in accordance with the present invention.
Figure 10:
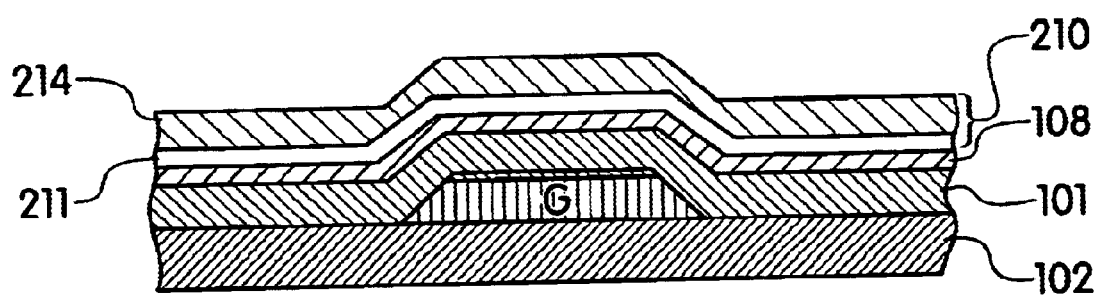
FIG. 10 is a cross-sectional view of the bottom gate thin film transistor showing a metal-dopant layer formed in accordance with the present invention.

Referring to FIG. 9, another embodiment is shown where a gate conductor G is patterned on a substrate 102. A gate insulator 101 is formed on gate G followed by a semiconductor layer 108. As shown in FIG. 10, source S and drain D are composed of material 210 which is deposited after a-Si layer (or polysilicon layer) 108, for example, in a back-channel etch bottom gate structure. Material 210 includes a metal-dopant layer 211 which is similar to metal dopant layer 106 as described above. In this embodiment, a highly conductive layer 214, such as, Cu or the like, is placed on top of material 211 (e.g., metal-dopant layer) instead of below it as described above with reference to FIGS. 5 through 8. In other embodiments, a single metal dopant layer may be employed without an additional highly conductive layer. The inclusion of layer 214 is preferred, but optional.

Figure 11:
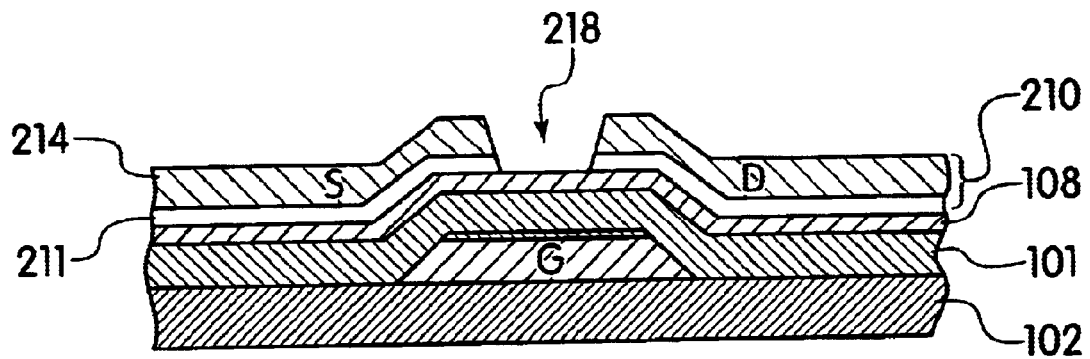
FIG. 11 is a cross-sectional view of the bottom gate thin film transistor showing the metal-dopant layer patterned in accordance with the present invention.

Referring to FIG. 11, a gap 218 is opened up between S and D down to layer 108 by employing a patterned etch process, for example a wet etch process, for removing a portion of layers 211 and 214 to form the gap 218.

Figure 12:
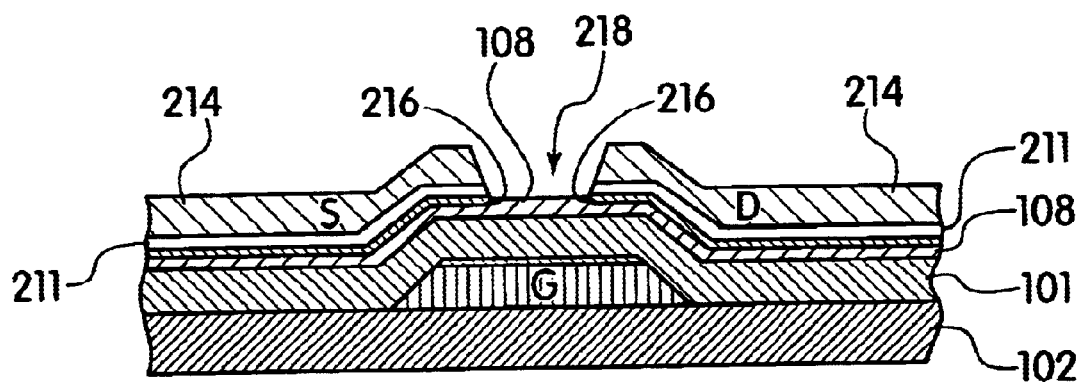
FIG. 12 is a cross-sectional view of the bottom gate thin film transistor showing a metal-dopant layer annealed to form ohmic contacts in accordance with the present invention.

Referring to FIG. 12, annealing is performed to diffuse dopants out of layer 211 into layer 108. Ohmic contacts 216 are formed by annealing the structure to outdiffuse dopants from material 211. Preferred deposition parameters and contact annealing are as described above. By first forming gap 218 and employing the present invention, many advantages are achieved over the prior art. For example, there is no need to perform an etch (e.g., reactive ion etch) to remove n+ material from layer 108 within the gap 218. Since gap 218 was formed first, the metal dopant layer 211 is not present in the gap 218. Therefore, the channel formed between S and D in the gap 218 is advantageously free from dopants diffused from the annealed layer 211!

It is to be understood that the present invention may be employed on a plurality of TFT or other device structures. For example, the present invention may be employed for the structures, e.g., coplanar bottom gate structures, described in a commonly assigned U.S. patent application Ser. No. 09/409,157, filed Sep. 30, 1999, entitled "HIGH PERFORMANCE THIN FILM TRANSISTOR AND ACTIVE MATRIX PROCESS FOR FLAT PANEL DISPLAYS," and incorporated herein by reference. Other structures and processes may be employed in the spirit of the present invention. For example, in polysilicon TFTs which are fabricated on quartz substrates, deposition and anneal temperatures may be as high as 800° C., depending on the metal-dopant used.

Figure 13:
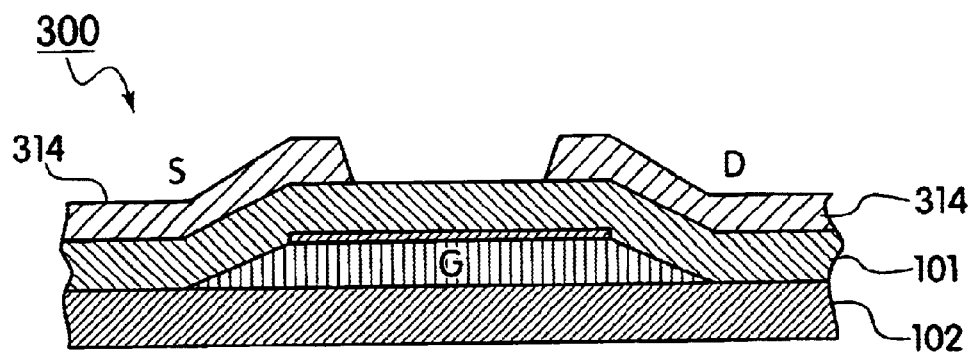
FIG. 13 is a cross-sectional view of a portion of a coplanar thin film transistor having a bottom gate structure in accordance with the present invention.
Figure 14:
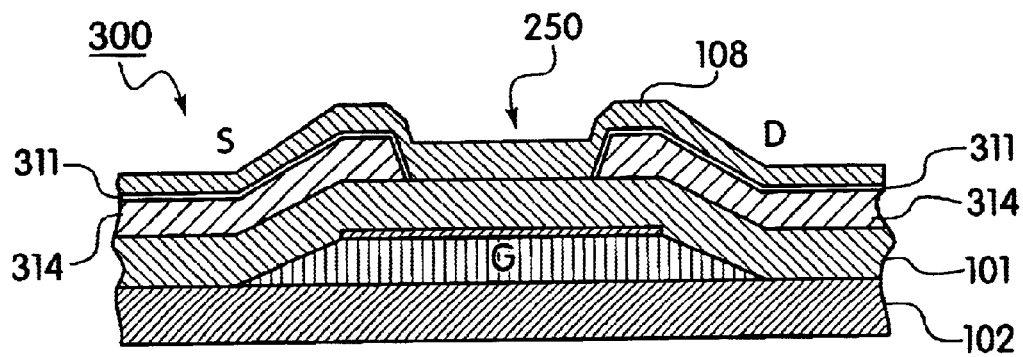
FIG. 14 is a cross-sectional view of the coplanar bottom gate thin film transistor of FIG. 13 showing a metal-dopant layer patterned in accordance with the present invention.
Figure 15:
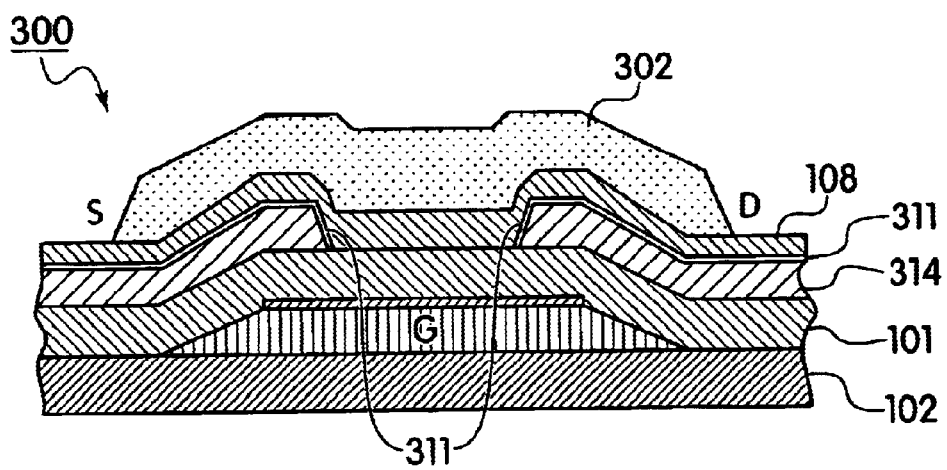
FIG. 15 is a cross-sectional view of the coplanar bottom gate thin film transistor of FIG. 14 showing a metal-dopant layer annealed to form ohmic contacts in accordance with the present invention.

Referring to FIGS. 13, 14 and 15, a coplanar bottom gate structure 300 is shown in accordance with the present invention. As shown in FIG. 13, metal-dopant layer 214 is patterned over an insulation layer 101 in a bottom gate structure. In FIG. 14, a semiconductor layer 108 is deposited over the metal-dopant layer 214. Ohmic contact layer 211 begins to form at the interface between layers 108 and 214, but advantageously not in gap 250. In FIG. 15, the structure 300 may be further annealed to enhance ohmic contacts 211 in layer 108 as described above. A passivation layer 302 is formed over layer 108.

Having described preferred embodiments for methods of forming ohmic contacts for thin-film transistors (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for forming ohmic contacts for semiconductor devices comprising the steps of:

forming a layer containing metal which includes dopants integrally formed therein;

patterning a source/drain region from said layer containing metal;

depositing a semiconductor layer for contacting with the layer containing metal, said semiconductor layer comprising a channel region; and annealing the semiconductor device to outdiffuse dopants from the layer containing metal into the semiconductor layer to form ohmic contacts therebetween, wherein the step of forming a layer containing metal includes the steps of forming a metal layer which includes dopants for contacting the semiconductor layer and forming a conductive layer which contacts the metal layer which includes dopants.

2. The method as recited in claim 1, wherein the step of patterning the layer containing metal to form components for a semiconductor device includes the step of patterning the layer containing metal to form source and drain metallizations for a thin film transistor.

3. The method as recited in claim 1, wherein the layer containing metal includes at least one of cobalt, molybdenum, titanium, chromium and nickel.

4. The method as recited in claim 1, wherein the layer containing metal which includes dopants integrally formed therein includes between about 1 to about 30 atomic percent of the dopants.

5. The method as recited in claim 1, wherein the layer containing metal which includes at least one of phosphorous, antimony, arsenic and boron integrally formed therein.

6. The method as recited in claim 1, wherein the step of depositing a semiconductor layer includes the step of depositing a layer of one of amorphous silicon and polycrystalline silicon.

7. The method as recited in claim 1, wherein the step of annealing the semiconductor device includes the steps of annealing the semiconductor device at temperatures between about 300° C. and about 400° C. for between about 10 and about 30 minutes.

8. The method as recited in claim 1, wherein the layer containing metal includes a transparent conductive oxide (TCO).

9. The method as recited in claim 1, wherein the step of forming a layer containing metal includes the step of forming the layer containing metal by one of co-sputtering, sputtering from a composite target, and chemical solution deposition.

10. A method for forming ohmic contacts for thin film transistors comprising the steps of:

patterning a gate conductor on a substrate;

forming an insulation layer over the gate structure;

depositing a layer containing silicon, said layer containing silicon comprising a channel of said thin-film transistor;

forming a layer containing metal which includes dopants integrally formed therein in contact with the layer containing silicon;

patterning the layer containing metal to form a gap over the gate conductor, the layer containing metal forming a source and drain for the thin film transistor; and annealing the thin film transistor to outdiffuse dopants from the layer containing metal into the layer containing silicon to form ohmic contacts therebetween.

11. The method as recited in claim 10, wherein the layer containing metal includes at least one of cobalt, molybdenum, titanium, chromium and nickel.

12. The method as recited in claim 10, wherein the layer containing metal which includes dopants integrally formed therein includes between about 1 to about 30 atomic percent of the dopants.

13. The method as recited in claim 10, wherein the layer containing metal which includes at least one of phosphorous, antimony, arsenic and boron integrally formed therein.

14. The method as recited in claim 10, wherein the step of depositing a layer containing silicon includes the step of depositing a layer of one of amorphous silicon and polycrystalline silicon.

15. The method as recited in claim 10, wherein the step of annealing the semiconductor device includes the steps of annealing the thin film transistor at temperatures between about 300° C. and about 400° C. for between about 10 and about 30 minutes.

16. The method as recited in claim 10, wherein the step of forming a layer containing metal includes the steps of:

forming a metal-dopant layer with dopants integrally formed therein for contacting the layer containing silicon; and forming a conductive layer which contacts the metal-dopant layer.

17. The method as recited in claim 10, wherein the layer containing metal includes a transparent conductive oxide (TCO).

18. The method as recited in claim 10, wherein the step of forming a layer containing metal includes the step of forming the layer containing metal by one of co-sputtering, sputtering from a composite target, and chemical solution deposition.

19. A method for forming ohmic contacts for thin film transistors comprising the steps of:

depositing an insulation layer on a substrate;

forming a layer containing metal which includes dopants integrally formed therein over the insulation layer;

patterning the layer containing metal to form a source and a drain for the thin film transistor having a gap therebetween;

depositing a layer containing silicon in contact with the insulation layer in the gap and in contact with the layer containing metal, said layer containing silicon comprising a channel of said thin-film transistor;

annealing the thin film transistor to outdiffuse dopants from the layer containing metal into the layer containing silicon to form ohmic contacts therebetween;

patterning a gate dielectric over the gap; and forming a gate conductor over the gap.

20. The method as recited in claim 19, wherein the layer containing metal includes at least one of cobalt, molybdenum, titanium, chromium and nickel.

21. The method as recited in claim 19, wherein the layer containing metal which includes dopants integrally formed therein includes between about 1 to about 30 atomic percent of the dopants.

22. The method as recited in claim 19, wherein the layer containing metal which includes at least one of phosphorous, antimony, arsenic and boron integrally formed therein.

23. The method as recited in claim 19, wherein the step of depositing a layer containing silicon includes the step of depositing a layer of one of amorphous silicon and polycrystalline silicon.

24. The method as recited in claim 19, wherein the step of annealing the semiconductor device includes the steps of annealing the thin film transistor at temperatures between about 300° C. and about 400° C. for between about 10 and about 30 minutes.

25. The method as recited in claim 19, wherein the step of forming a layer containing metal includes the steps of:

forming a metal-dopant layer with dopants integrally formed therein for contacting the layer containing silicon; and forming a conductive layer which contacts the metal-dopant layer.

26. The method as recited in claim 19, wherein the layer containing metal includes a transparent conductive oxide.

27. The method as recited in claim 19, wherein the step of forming a layer containing metal includes the step of forming the layer containing metal by one of co-sputtering, sputtering from a composite target, and chemical solution deposition.

* * * * *